United States Patent [19]
Mertes et al.

[11] Patent Number: 5,935,759
[45] Date of Patent: Aug. 10, 1999

[54] METHOD FOR MAKING A MULTICOLOR IMAGE AND PHOTOSENSITIVE MATERIAL THEREFOR

[75] Inventors: Jürgen Mertes, Gau-Algesheim; Martin Benzing, Biebelnheim; Dieter Bodenheimer, Aarbergen; Dieter Mohr, Appenheim, all of Germany

[73] Assignee: AGFA-Gevaert, Mortsel, Belgium

[21] Appl. No.: 08/838,976

[22] Filed: Apr. 23, 1997

Related U.S. Application Data

[60] Provisional application No. 60/021,501, Jul. 10, 1996.

[30] Foreign Application Priority Data

Apr. 23, 1996 [EP] European Pat. Off. ............ 96201083

[51] Int. Cl.$^6$ ................ G03C 1/795; G03C 1/805; G03F 7/11; G03F 7/34
[52] U.S. Cl. .................... 430/257; 430/260; 430/293
[58] Field of Search .................... 430/260, 262, 430/263, 293, 257

[56] References Cited

U.S. PATENT DOCUMENTS

| | | | |
|---|---|---|---|
| 3,765,898 | 10/1973 | Bauer et al. | 96/115 |
| 4,885,225 | 12/1989 | Heller et al. | 430/160 |
| 4,889,787 | 12/1989 | Musser | 430/166 |
| 4,895,787 | 1/1990 | Platzer | 430/253 |
| 5,049,476 | 9/1991 | Platzer | 430/253 |
| 5,478,694 | 12/1995 | Maerz et al. | 430/257 |
| 5,534,384 | 7/1996 | Platzer et al. | 430/260 |

FOREIGN PATENT DOCUMENTS

| | | |
|---|---|---|
| 0 339 860 | 11/1989 | European Pat. Off. . |
| 0 556 732 | 8/1993 | European Pat. Off. . |

*Primary Examiner*—John S. Chu
*Attorney, Agent, or Firm*—Foley & Lardner

[57] ABSTRACT

Disclosed are a photosensitive material and a corresponding method for making colour-proofing sheets for multicolour printing, comprising A) a transparent flexible polymeric support sheet, B) a photopolymerizable layer comprising B1) a polymeric binder, B2) a free-radically polymerizable compound, B3) a photoinitiator, and B4) a dye or pigment in a primary colour of multicolour printing, and C) a thermoplastic adhesion-promoting layer on the photosensitive layer, with a coating weight of 2 to 30 g/m$^2$, characterized in that the thermoplastic adhesion-promoting layer includes 0.05 to 2.5% by weight of a colourless, transparent or white pigment having an average particle size which is less than 1% of the layer thickness and does not exceed 0.05 $\mu$m and the ready-produced material has a slip friction coefficient of <0.5.

16 Claims, No Drawings

METHOD FOR MAKING A MULTICOLOR IMAGE AND PHOTOSENSITIVE MATERIAL THEREFOR

This application claims is the benefit of U.S. Provision Application No. 60/021,501 filed Jul. 10, 1996.

DESCRIPTION

Field of the Invention

The invention relates to a photosensitive, especially photopolymerizable, material for making colour-proofing sheets for multicolour printing. It further relates to a colour-proofing method in which a multicolour image is produced from a plurality of primary colour images in register on an image-receiving material. The primary colour images are made by laminating a photopolymerizable layer in one primary colour onto the image-receiving material, exposing under the respective colour separation film, developing the image by peeling the support sheet for the photopolymerizable layer off together with the non-image areas, and repeating the same steps with a photopolymerizable layer in another primary colour.

Such a colour-proofing method and a material for it are known from U.S. Pat. No. 4,895,787 and 5,049,476. This material consists of a transparent support sheet whose surface has preferably been pretreated for adhesion promotion, a photopolymerizable layer including a dye or pigment in a primary colour of multicolour printing, and, on the photopolymerizable layer, a thermally activable adhesion-promoting layer. After lamination to an image-receiving material and exposure through the support sheet, the material is developed by peeling the support sheet and image-receiving material apart. The exposed areas of the photosensitive colour layer adhere to the support sheet, while the unexposed areas remain on the image-receiving material together with the entire adhesion-promoting layer. Thus, the method is positive-working; that is, a positive image of the original is created on the image-receiving material.

This processing method has the great advantage of a development step which does not require any alkaline or acidic solutions and no organic solvents, eliminating disposal thereof. A disadvantage of this method is the fact that the thermoplastic adhesion-promoting layers tend to block when the material is stacked or wound. The result can be that, on prolonged storage, especially at elevated temperature, the adhesion-promoting layer adheres to the back of the adjacent sheet so strongly that it can no longer be separated therefrom without damage. Furthermore, when these sheets are overlaid in the course of lamination, air inclusions may form, which, owing to the tendency of the layers to block or stick, no longer automatically disappear and then lead to processing problems.

U.S. Pat. No. 4,889,787 discloses a photosensitive material for making colour-proofing sheets on the basis of photosensitive diazo oxides, comprising an adhesion-promoting layer comprising silica pigments. The pigments used there are intended to prevent the blocking of the adhesion-promoting layer and have an average particle size which exceeds the thickness of the adhesion-promoting layer.

AU-A 31796/89 describes the use of polymer particles to prevent the blocking of the thermally activable adhesion-promoting layer in a solvent-developable diazo resin system, whose diameter likewise exceeds the thickness of the adhesion-promoting layer. The silica pigments of very small average particle sizes (<0.05 µm) also used in this application as a negative example are specifically described as completely ineffective with regard to an antiblocking effect.

In contrast, EP-A 0 556 732 describes in relation to a system as described herein the addition of pigments to the adhesion-promoting layer to reduce the blocking, subject to the proviso that the average particle sizes of the pigments have to be less than the thickness of the adhesion-promoting layer in order that an optimum effect may be achieved. However, this application likewise teaches that pigments having very small average particle sizes (<0.05 µm or less than 1% of the thickness of the adhesion-promoting layer) do not prevent the blocking of the adhesion-promoting layer.

It is an object of the present invention to provide a photosensitive material and a colour-proofing method as classified at the beginning, which, in the processing by lamination and peeling apart, are free of any tendency to stick or to develop air inclusions, and, in the case of which, the material can be wound on a roll and stored without the need for measures such as, for example, the insertion of in-between papers or films to prevent sticking.

This invention provides a photosensitive material for making colour-proofing sheets for multicolour printing, comprising A) a transparent flexible polymeric support sheet,
B) a photopolymerizable layer comprising
   B1) a polymeric binder,
   B2) a free-radically polymerizable compound,
   B3) a compound capable of initiating the polymerization of (B2) under the action of actinic light, and
   B4) a dye or pigment in a primary colour of multicolour printing, and
C) a thermoplastic adhesion-promoting layer on the photosensitive layer.

The material of the invention is characterized in that the thermoplastic adhesion-promoting layer includes 0.05 to 2.5% by weight of a colourless, transparent or white pigment having an average particle size which is less than 1% of the layer thickness and does not exceed 0.05 µm and the ready-produced material has a slip friction coefficient of <0.5.

The suitability of pigments of this magnitude for creating an antiblocking effect is completely surprising and is in stark contrast to the prior art.

From another aspect, the invention provides a method for making a multicolour image, characterized in that a photosensitive material of the composition indicated above is laminated with the adhesion-promoting layer under pressure onto an image-receiving material, subjected to imagewise exposure through the support sheet under a colour separation before or after lamination, the support sheet is peeled off the image-receiving material together with the exposed areas, and the steps of lamination, exposure and peeling off are repeated with at least one further colour separation, the exposure taking place in register with the first primary colour image produced on the image-receiving material.

The adhesion-promoting layer of the material according to the invention includes as essential feature a colourless, transparent or white pigment which has a particle size within a certain range and which is present in a proportion within a certain range such that it is not visible in a transparent polymer layer.

The pigment can be inorganic or organic in nature and has to be insoluble in the coating solvent used for the adhesion-promoting layer. Since the solvent used is preferably water or a mixture consisting predominantly of water, a multiplicity of water-insoluble substances are suitable for use as pigments. Examples are silicas, aluminas, silicates, phosphates, borates and other inorganic salts or oxides. Also suitable are organic polymers, such as polyethylene, polypropylene, polyesters, polycarbonates, phenolic resins and other water-insoluble substances. In general, inorganic pigments are preferred.

The pigment is present in a proportion of 0.05 to 2.5% by weight, based on the weight of the adhesion-promoting layer. Preference is given to proportions of 0.1 to 1.5% by weight, in particular of 0.2 to 1.0% by weight.

The average particle size of the pigment should be less than 1% of the thickness of the adhesion-promoting layer and not exceed a size of 0.05 $\mu$m. The thickness of the adhesion-promoting layer is usually reported as coating weight and ranges from 2 to 30 g/m$^2$. For a density of about 1, this corresponds to 2 to 30 $\mu$m. The particle size is therefore generally between 0.005 and 0.050 $\mu$m, preferably between 0.010 and 0.045 $\mu$m.

Although the prior art does not ascribe an antiblocking effect to particles of this order of magnitude, it was surprisingly found in the case of our system that, in a certain dosage, only particles of this order of magnitude are capable of effecting an antiblocking action to the effect that the colour-proofing material, after fabrication, can be rolled up without intermediate paper or film and can be stored on the roll even under a pressure without other material properties suffering as a result.

The dosage has to be chosen so that the ready-produced material has a slip friction coefficient of <0.5, preferably <0.3.

The pigments should be readily dispersible in the usually aqueous solutions used for coating. Silica pigments have been found to be particularly useful.

The adhesion-promoting layer is applied directly to the photopolymerizable layer from a solvent or solvent mixture which does not even incipiently dissolve the photopolymerizable layer, and dried. Suitable solvents which do not incipiently dissolve the colour layer are water or a mixture consisting predominantly of water, and saturated hydrocarbons. Many polymers can be applied from aqueous dispersion; however, application from solution is preferred. Suitable for this are for example salts of polymers having acid groups, for example carboxyl groups. A preferred example is an aqueous alkaline solution of a vinyl acetate/crotonic acid copolymer (®Mowilith Ct5). Other suitable polymers are polyvinyl acetate or polyacrylate dispersions. The polymer should have a softening temperature within the range from 40 to 200° C., preferably from 60 to 120° C., and preferably a $T_g$ value within the range from 20 to 60° C. As well as the thermoplastic polymer, the adhesion-promoting layer may additionally include plasticizers, residual solvent, planarizers, lubricants, antistats, optical brighteners and/or UV absorbers. Its coating weight in the dry state is normally 2 to 30, preferably 3 to 15, g/m$^2$. Suitable adhesion-promoting layers are also described in U.S. Pat. No. 4,895,787 and EP-A 525 624.

The photopolymerizable layer of the material of the invention includes as essential constituents a polymeric binder, a free-radically polymerizable compound, a photoinitiator and a dye or pigment in a primary colour of multicolour printing. Examples of photopolymerizable layers of this general composition are described in U.S. Pat. No. 4,895,787, incorporated by reference.

Suitable photoinitiators are various kinds of the compounds or combinations of compounds known for this purpose. Examples are benzoin ether, benzil ketals, polycyclic quinones, benzophenone derivatives, triarylimidazolyl dimers, and photosensitive trihalomethyl compounds, for example trichloromethyl-s-triazines. Preference is given to 2,3-bisarylquinoxalines as described in U.S. Pat. No. 3,765,898 and 2-aryl-4,6-bistrichloromethyl-s-triazines. The amount of photoinitiator or photoinitiator combination is generally between 1 and 25, preferably between 5 and 15, % by weight.

The polymeric binder is intended to confer homogeneity and strength on the layer. Suitable binders are styrene/maleic anhydride and styrene/maleic monoester copolymers, acrylic ester polymers and copolymers, polyamides, polyvinylpyrrolidones, cellulose derivatives, such as cellulose esters and ethers, phenolic resins, polyvinyl esters, polyvinylacetals, for example polyvinyl butyral, polyvinyl propional or polyvinyl formal. The proportion of binder is generally 15 to 70, preferably 20 to 50, % by weight, based on the weight of the solid layer.

The polymerizable compound contains at least one, preferably at least two, terminal free-radically polymerizable double bonds, and is not gaseous at normal pressure and temperatures below 100° C. Preference is given to esters and amides of acrylic acid and methacrylic acid. Especially the esters with polyhydric alcohols are used with advantage. Examples are di-, tri-, tetra- and polyethylene glycol di(meth)acrylate, the di(meth)acrylates of oligo- and polypropylene glycols, 1,4-butanediol di(meth)acrylate, trimethylolpropane and trimethylolethane di- and tri(meth)acrylate, pentaery- thritol tri- and tetraacrylate or -methacrylate, dipentaerythritol tetra-, penta- and hexa (meth)acrylate. The proportion of polymerizable compound is generally 15 to 70, preferably 20 to 60, % by weight.

In the preferred use of the novel material for colour proofing in multicolour printing, the dyes and colour pigments are selected so that they correspond to the primary colours of multicolour printing, cyan (blue-green), magenta (purple), yellow and black. Pigments are generally preferred. Examples are Permanent Yellow G (C.I. 21 095), Permanent Yellow GR (C.I. 21 100), Permanent Yellow DHG (C.I. 21 090), Permanent Rubine L6B (C.I. 15 850:1), Permanent Pink F3B (C.I. 12 433), ®Hostaperm Pink E (C.I. 73 915), ®Hostaperm Reddish Violet ER (C.I. 46 500), Permanent Carmine FBB (C.I. 12 485), ®Hostaperm Blue B2G (C.I. 74 160), ®Hostaperm Blue A2R (C.I. 74 160) and ®Printex 25 (carbon black). If necessary, the pigments can be blended to obtain the desired hue. The inorganic or organic pigments are generally dispersed or pasted up in a suitable solvent together with part of the binder. The average particle size is generally below 1 $\mu$m.

The proportion of the dye or pigment is generally 8 to 40, preferably 12 to 30, % by weight.

The photopolymerizable layer may include further constituents, such as hydrogen donors, polymerization inhibitors, plasticizers, residual solvents, surfactants, planarizers, lubricants, antistats, inert fillers, optical brighteners and/or UV absorbers. It generally has a coating weight of 0.2 to 5, preferably 0.3 to 3, g/m$^2$.

The support sheets used are transparent, flexible, dimensionally stable sheets composed of plastics, for example polyesters, polycarbonates, etc. Particular preference is given to polyester sheets, especially biaxially oriented and heat-set sheets, for example of polyethylene terephthalate. These should remain dimensionally at the required lamination temperatures, i.e. from about 60 to 150° C. Their thickness is generally 10 to 200, preferably 25 to 80, $\mu$m. The support sheet is advantageously given an adhesion-promoting pretreatment on one or both sides and can have a smooth or rough/matte surface, preferably a smooth surface.

To practise the method of the present invention, the above-described photosensitive material is laminated with the adhesion-promoting layer face down onto an image-receiving material. The latter can consist of polymer, polymer-coated specialty paper or of normal printing paper. Other white or else in some cases non-white receiving materials can also be used. A printing paper which is dimensionally stable under the laminating conditions is usually preferred, since it creates a visual impression substantially approaching the later print. The laminating is advantageously carried out under pressure and at elevated temperature in an apparatus intended for this purpose. The laminating temperature is usually in the range from 60 to 150° C., preferably between 80 and 130° C. Before or preferably after lamination, the photopolymerizable layer is subjected to imagewise exposure in a conventional manner through the support sheet, generally in contact under a positive colour separation. After lamination and exposure, the support sheet is peeled off by hand or in a suitable apparatus. The peeling angle should be at least 90°, and an angle of 180° is particularly preferred. Peeling removes the exposed areas of the photopolymerizable layer with the support sheet, while the unexposed areas remain behind on the image-receiving material together with the entire adhesion-promoting layer. This results in a positive primary colour image being obtained. Each further colour-proofing sheet is laminated in the manner described onto the preceding primary colour image, exposed there in register and developed by peeling the support sheet off. In this way the primary colour images in the colours of cyan (blue-green), magenta (purple), yellow and black create a complete multicolour image which corresponds to the later 4-colour print. If desired, it is of course also possible to use colour sheets in specialty colours.

The ready-produced multicolour image has a bright surface. If desired, the surface can be matted by, for example, laminating onto it a sheet having a rough surface and peeling it off again. The surface of the ready-produced proof image can be protected against scratching or sticking at elevated temperatures by means of a protective layer.

EXAMPLES

The examples which follow illustrate the invention. All percentages and proportions are by weight. Examples 1 and 2 are comparative examples. Examples 3 to 7 demonstrate the advantages of the invention.

Example 1 (Comparative Example 1)

The following solutions were applied to 50 μm thick, biaxially oriented and heat-set polyester sheets (®Melinex 505) pretreated for adhesion promotion on both sides:

|  | Cyan | Magenta | Yellow | Black |
| --- | --- | --- | --- | --- |
| Dipentaerythritol pentaacrylate | 19.9 | 25.0 | 21.6 | 19.9 |
| 2,3-Bis(4-methoxyphenyl)quinoxaline | 5.1 | 6.1 | 5.4 | 5.3 |
| Polyvinyl formal (®Formvar 12/85) | 16.3 | 23.0 | 18.4 | 14.2 |
| Copolymer of a polyether-modified polysiloxane with 80% by weight of ethylene oxide and 20% by weight of propylene oxide units in the polyether portion Viscosity 240 cSt/25° C., MW: about 6500 | 0.2 | 0.2 | 0.2 | 0.2 |
| ®Hostaperm Blue B2G (C.I. 74 160) | 9.7 |  |  |  |
| Permanent Red FBB (C.I. 12 485) |  | 12.9 |  |  |
| Permanent Yellow GR (C.I. 21 100) |  |  | 8.6 |  |
| Carbon black (®Printex 25) |  |  |  | 13.6 |
| Tetrahydrofuran | 398.6 | 363.9 | 382.4 | 378.8 |
| 4-Hydroxy-4-methyl-2-pentanone | 113.9 | 121.3 | 124.3 | 123.1 |
| 1-Methoxy-2-propanol | 360.6 | 326.5 | 353.7 | 331.5 |
| γ-Butyrolactone | 75.9 | 121.3 | 86.0 | 113.6 |

The pigments were dispersed with part of the binder and of the butyrolactone. The average particle size was below 200 nm.

The coated sheets were dried in a drying duct at temperatures up to 110° C. The coating weight was between 0.6 and 0.8 g/m².

Atop the dry photopolymerizable layer the following adhesion-promoting layer solution was applied:

| Vinyl acetate/crotonic acid copolymer 95:5 | 50.0 parts |
| --- | --- |
| Pyrogenic silica (average particle size 3 μm) | 0.08 part |
| Water | 252 parts |
| Ethanol | 24.0 parts |
| Aqueous ammonia, 25% strength | 5.0 parts |

The coated sheets were dried in a drying duct at temperatures of 100° C. The coating weight was 6.5 g/cm².

On laminating the sheets, there were neither air inclusions or holes in the image areas after the peeling off of the ®Melinex sheet.

The photosensitive sheets were stored at 25° C. on a roll (core 300 mm, winding tension 400 N), without in-between material, i.e. layer on sheet.

After about 4 days the stored materials were no longer satisfactorily unwindable off the roll; they had become blocked.

Example 2 (Comparative Example 2)

Atop a photosensitive layer prepared according to Example 1 was applied an adhesive layer of the following composition:

| Vinyl acetate/crotonic acid copolymer 95:5 | 50.0 parts |
| --- | --- |
| Pyrogenic silica (average particle size 3 μm) | 0.16 part |
| Water | 252 parts |
| Ethanol | 24.0 parts |
| Aqueous ammonia, 25% strength | 5.0 parts |

The coated sheets were dried in a drying duct at temperatures of 100° C. The coating weight was 6.5 g/m².

On laminating the sheets, numerous pinholes were found in the image areas after the ®Melinex sheet had been peeled off.

Example 3

Atop a photosensitive layer prepared according to Example 1 was applied an adhesive layer of the following composition:

| Vinyl acetate/crotonic acid copolymer 95:5 | 50.0 parts |
|---|---|
| Pyrogenic silica | 0.08 part |
| (average particle size 40 nm) | |
| Water | 252 parts |
| Ethanol | 24.0 parts |
| Aqueous ammonia, 25% strength | 5.0 parts |

The coated sheets were dried in a drying duct at temperatures of 100° C. The coating weight was 6.5 g/m².

On laminating the sheets there were neither air inclusions or holes in the image areas after the peeling off of the ®Melinex sheet.

The photosensitive sheets were stored at 25° C. on a roll (core 300 mm, winding tension 400 N), without in-between material, i.e. layer on sheet.

After about 6 days the stored materials were no longer satisfactorily unwindable off the roll; they had become blocked.

Example 4

Atop a photosensitive layer prepared according to Example 1 was applied an adhesive layer of the following composition:

| Vinyl acetate/crotonic acid copolymer 95:5 | 50.0 parts |
|---|---|
| Pyrogenic silica | 0.08 part |
| (average particle size 15 nm) | |
| Water | 252 parts |
| Ethanol | 24.0 parts |
| Aqueous ammonia, 25% strength | 5.0 parts |

The coated sheets were dried in a drying duct at temperatures of 100° C. The coating weight was 6.5 g/m².

On laminating the sheets there were neither air inclusions or holes in the image areas after the peeling off of the ®Melinex sheet.

The photosensitive sheets were stored at 25° C. on a roll (core 300 mm, winding tension 400 N), without in-between material, i.e. layer on sheet.

After about 6 days the stored materials were no longer satisfactorily unwindable off the roll; they had become blocked.

Example 5

Atop a photosensitive layer prepared according to Example 1 was applied an adhesive layer of the following composition:

| Vinyl acetate/crotonic acid copolymer 95:5 | 50.0 parts |
|---|---|
| Pyrogenic silica | 0.16 part |
| (average particle size 40 nm) | |
| Water | 252 parts |
| Ethanol | 24.0 parts |
| Aqueous ammonia, 25% strength | 5.0 parts |

The coated sheets were dried in a drying duct at temperatures of 100° C. The coating weight was 6.5 g/m².

On laminating the sheets there were neither air inclusions or holes in the image areas after the peeling off of the ®Melinex sheet.

The photosensitive sheets were stored at 25° C. on roll (core 300 mm, winding tension 400 N), without in-between material, i.e. layer on sheet.

After about 20 days the stored materials were still satisfactorily unwindable off the roll; they had not become blocked.

Example 6

Atop a photosensitive layer prepared according to Example 1 was applied an adhesive layer of the following composition:

| Vinyl acetate/crotonic acid copolymer 95:5 | 50.0 parts |
|---|---|
| Pyrogenic silica | 0.16 part |
| (average particle size 15 nm) | |
| Water | 252 parts |
| Ethanol | 24.0 parts |
| Aqueous ammonia, 25% strength | 5.0 parts |

The coated sheets were dried in a drying duct at temperatures of 100° C. The coating weight was 6.5 g/m².

On laminating the sheets there were neither air inclusions or holes in the image areas after the peeling off of the ®Melinex sheet.

The photosensitive sheets were stored at 25° C. on a roll (core 300 mm, winding tension 400 N), without in-between material, i.e. layer on sheet.

After about 20 days the stored materials were still satisfactorily unwindable off the roll; they had not become blocked.

Example 7

Atop a photosensitive layer prepared according to Example 1 was applied an adhesive layer of the following composition:

| Vinyl acetate/crotonic acid copolymer 95:5 | 50.0 parts |
|---|---|
| Pyrogenic silica | 0.16 part |
| (average particle size 15 nm) | |
| Water | 252 parts |
| Ethanol | 24.0 parts |
| Aqueous ammonia, 25% strength | 5.0 parts |

The coated sheets were dried in a drying duct at temperatures of 100° C. The coating weight was 3 g/m².

On laminating the sheets there were neither air inclusions or holes in the image areas after the peeling off of the ®Melinex sheet.

The photosensitive sheets were stored at 25° C. on a roll (core 300 mm, winding tension 400 N), without in-between material, i.e. layer on sheet.

After about 20 days the stored materials were still satisfactorily unwindable off the roll; they had not become blocked.

We claim:

1. A photosensitive material for making colour-proofing sheets for multicolour printing, comprising
  A) a transparent flexible polymeric support sheet,
  B) a photopolymerizable layer comprising
    B1) a polymeric binder,
    B2) a free-radically polymerizable compound,
    B3) a compound capable of initiating the polymerization of (B2) under the action of actinic light, and
    B4) a dye or pigment in a primary colour of multicolor printing, and
  C) a thermoplastic adhesion-promoting layer on the photosensitive layer, with a coating weight of 2 to 30 g/m², characterized in that the thermoplastic adhesion-promoting layer includes 0.05 to 2.5% by weight of a water-insoluble colorless, transparent or white pigment having an average particle size which is less than 1% of the layer thickness and does not exceed 0.05 μm and the ready-produced material has a slip friction coefficient of <0.5.

2. A photosensitive material according to claim 1 characterized in that the average particle size of the pigment in the adhesion-promoting layer is between 0.010 and 0.045 μm.

3. A photosensitive material according to claim 1, characterized in that the pigment in the adhesion-promoting layer is an inorganic pigment.

4. A photosensitive material according to claim 1 characterized in that the thermoplastic adhesion- promoting layer includes 0.2 to 1.0% by weight of pigment.

5. A photosensitive material according to claim 1 characterized in that the slip friction coefficient of the ready-produced material is <0.3.

6. A photosensitive material according to claim 1 characterized in that the coating weight of the adhesion-promoting layer is 3 to 15 g/m².

7. A photosensitive material according to claim 1 characterized in that the thermoplastic adhesion-promoting layer has a glass transition temperature $T_g$ of 20 to 100° C.

8. A photosensitive material according to claim 1 characterized in that the free-radically polymerizable compound contains at least two polymerizable groups.

9. A photosensitive material according to claim 1 characterized in that the free-radically polymerizable compound is an acrylic or methacrylic ester.

10. A photosensitive material according to claim 1 characterized in that the photopolymerizable layer has a coating weight of 0.2 to 5 g/m².

11. A method for making a multicolour image, characterized in that a photosensitive material of the composition indicated in claim 1 is laminated with the adhesion-promoting layer under pressure onto an image-receiving material, subjected to imagewise exposure through the support sheet under a colour separation before or after lamination, the support sheet is peeled off the image-receiving material together with the exposed areas of the photopolymerizable layer after lamination and exposure, and the steps of lamination, exposure and peeling off are repeated with at least one further colour separation, the exposure taking place in register with the first primary colour image produced on the image-receiving material.

12. A photosensitive material according to claim 1, wherein the pigment in the adhesion-promoting layer is selected from the group consisting of a silica, an alumina, a silicate, a phosphate, and a borate.

13. A photosensitive material according to claim 1, wherein the pigment in the adhesion-promoting layer is selected from the group consisting of a polyethylene, a polypropylene, a polyester, a polycarbonate, and a phenolic resin.

14. A photosensitive material according to claim 1, wherein the pigment in the adhesion-promoting layer comprises a silica.

15. A photosensitive material according to claim 1, wherein the pigment in adhesion-promoting layer comprises pyrogenic silica.

16. A photosensitive material comprising
A) a transparent flexible polymeric support sheet,
B) a photopolymerizable layer comprising
B1) a polymeric binder,
B2) a free-radically polymerizable compound,
B3) a compound capable of initiating the polymerization of (B2) under the action of actinic light, and
B4) a dye or pigment in a primary colour of multicolor printing, and
C) a thermoplastic adhesion-promoting layer on the photosensitive layer, with a coating weight of 2 to 30 g/m², which comprises 0.05 to 2.5% by weight of a water-insoluble colorless, transparent or white pigment having an average particle size which is less than 1% of the layer thickness and does not exceed 0.05 μm and the ready-produced material has a slip friction coefficient of <0.5.

* * * * *